United States Patent [19]

Fitzer et al.

[11] Patent Number: 4,540,606
[45] Date of Patent: Sep. 10, 1985

[54] METHOD OF FORMING A HEAT-BARRIER LAYER ON A METAL SUBSTRATE

[75] Inventors: Erich Fitzer, Karlsruhe; Karl Brennfleck, Karlsruhe-Grötzingen; Jürgen Schlichting, deceased, late of Karlsruhe, all of Fed. Rep. of Germany, by Isabella Fischer, administrator

[73] Assignee: MTU Motoren-und Turbinen-Union Munchen GmbH, Munich, Fed. Rep. of Germany

[21] Appl. No.: 631,585

[22] Filed: Jul. 17, 1984

[30] Foreign Application Priority Data

Jul. 28, 1983 [DE] Fed. Rep. of Germany ....... 3327216

[51] Int. Cl.$^3$ ............................................... B05D 5/00
[52] U.S. Cl. .................................. 427/247; 427/255.2; 428/613; 428/680
[58] Field of Search .................. 427/255.2, 255.3, 247; 428/613, 680

[56] References Cited

U.S. PATENT DOCUMENTS 4,265,982  5/1981  McCreary ........................ 427/247
4,299,865  11/1981  Clingman ......................... 427/247

Primary Examiner—Sam Silverberg
Attorney, Agent, or Firm—Roberts, Spiecens & Cohen

[57] ABSTRACT

A method for the application or impregnation of a highly adherent heat-barrier layer on a metal substrate comprising effecting chemical vapor-phase deposition of zirconium dioxide as a heat-barrier layer with infiltration by finely granular zirconium dioxide in a metal felt. The vapor-phase deposition with infiltration of the metal felt can take place, in particular, from zirconium chloride, preferably within a temperature range between 550° C. and 750° C.

9 Claims, No Drawings

METHOD OF FORMING A HEAT-BARRIER LAYER ON A METAL SUBSTRATE

FIELD OF THE INVENTION

The present invention relates to a method of applying a heat-barrier layer on a metal substrate.

PRIOR ART

Because of its low thermal conductivity, zirconium dioxide has proven to be a good heat-barrier material even at temperatures above 1000° C. It is known to apply layers of zirconium dioxide to dense metallic substrates by plasma spraying. However, a disadvantage of this method is the high residual porosity of such layers as well as their poor resistance to wear.

SUMMARY OF THE INVENTION

An object of the present invention is to provide a method for applying a heat-barrier layer on a metal substrate in which a firmly adherent heat-barrier layer of high efficiency is formed on a suitable metal substrate in a simple and rapid manner.

This and other objects of the invention is achieved by effecting a chemical vapor-phase deposition of zirconium dioxide as a heat-barrier layer by infiltration of finely granular zirconium dioxide in a metal felt serving as a metal substrate.

The metal felt itself can be affixed to a dense metal substrate, for instance one consisting of nickel-base alloys.

Very finely granular, dense heat-barrier layers can be produced by vapor-phase deposition methods in accordance with the invention.

For the production of such zirconium-dioxide layers several methods may be used. The vapor-phase deposition with infiltration of a metal felt can be effected from zirconium chlorides by the hydrolysis of zirconium tetrachloride with water which is produced in a secondary reaction from hydrogen and carbon dioxide resulting in very favorable conditions with respect to the reaction velocity and the extent of variation in the microstructure.

All zirconium dioxide vapor-phase deposition methods (CVD methods) fundamentally have the disadvantage in common of the poor strength of adherence between the layer and a dense metal substrate, caused by the difference in the mechanical, thermal and chemical properties of the two materials. The low speed of coating is also a disadvantage.

It has been surprisingly found that a substantial improvement in the adherence strength as well as an increase in the rate of deposition can be obtained if the metal felt consists of material which is resistant to high temperature and corrosion, and preferably is an alloy having a base of nickel and/or cobalt. Alloys such as NiCr, NiCrAl, Hastelloy X ®, NiCrAlY and CoCrAlY are preferred. The metal felt can be infiltrated in such a manner that the density of the deposited zirconium dioxide decreases from the surface of the felt towards the surface of the dense metal substrate to which it is affixed. The residual porosity of the felt at the juncture surface with the dense substrate reduces the stresses between the dense substrate and the layer.

The impregnation of a felt structure furthermore has the advantage that the rate of layer growth is greatly increased as a result of the large internal surface. This rate of layer growth can be controlled by means of the porosity of the metal felt. The porosities of felts suitable for the invention and available on the market are between 45% and 95%.

DETAILED DESCRIPTION OF PREFERRED EMBODIMENTS

The invention will be described hereafter with reference to a specific example of a best mode for carrying out the method of the invention.

EXAMPLE

Various metal felts of alloys of nickel, cobalt and combinations thereof e.g. Hastelloy X ® with porosities between 45 and 95% were impregnated with $ZrO_2$ to form heat barrier layers respectively at temperatures of 750° C. and at 650° C. in a hot-wall coating apparatus. In both cases, the $ZrO_2$ heat-barrier layers were produced by hydrolysis of $ZrCl_4$ with water. The partial pressure of the zirconium tetrachloride is $10^{-1}$ mbar at a total pressure of 10 mbar, a hydrogen rate of flow of 5 liters per hour and a carbon-dioxide rate of flow of 2.5 liters per hour.

The rate of deposition was 30 mg/cm$^3$hr at 750° C. and 14 mg/cm$^3$ hr at 650° C.

However, the depths of penetration of the zirconium dioxide and its microstructure differ more than the rates of deposition at the different coating temperatures. Thus at 750° C., coarsely granular zirconium dioxide having a high residual porosity and a depth of penetration of at most 100 $\mu$m can be obtained while at 650° C. the zirconium dioxide penetrates more than 300 $\mu$m and finely granular compact layers are formed. In this way, protective pipes, nozzles and parts of turbines can be advantageously provided with a well-adhering heat-barrier layer.

By the simultaneous use of other oxide formers, such as $YCl_3$, mixed oxides can be deposited, whereby specific crystallographic modifications of zirconium oxide, for instance the cubic form $ZrO_2.nY_2O_3$ partially or completely stabilized can be deposited.

Although the invention has been described with reference to various embodiments thereof, it will become apparent to those skilled in the art that numerous modifications and variations can be made within the spirit and scope of the invention as defined in the attached claims.

What is claimed is:

1. A method of forming a heat-barrier layer for a dense metal body, said method comprising forming a metal substrate of a porous metal felt, and effecting chemical vapor-phase deposition of zirconium dioxide as a heat-barrier layer by infiltration of finely granular zirconium dioxide in said metal felt in non-uniform distribution from one surface of said metal felt into the interior thereof towards the other surface of the metal felt, the metal substrate being affixable to a dense metal body by attaching said other surface of the infiltrated metal felt to the dense metal body.

2. A method as claimed in claim 1 wherein the zirconium dioxide is chemically precipitated from zirconium chloride.

3. A method as claimed in claim 1 comprising affixing the metal felt to said dense metal body.

4. A method as claimed in claim 1 wherein said metal felt consists of a material which is resistant to high temperatures and corrosion.

5. A method as claimed in claim 4 wherein said metal felt consists of an alloy having a base of nickel and/or cobalt.

6. A method as claimed in claim 1 wherein said vapor-phase deposition is effected at a temperature below 1000° C.

7. A method as claimed in claim 6 wherein said vapor-phase deposition is effected at a temperature between 550° C. and 750° C.

8. A method as claimed in claim 1 wherein the vapor-phase deposition produces partially or completely stabilized cubic $ZrO_2.nY_2O_3$ by simultaneous deposition of $Y_2O_3$.

9. A method as claimed in claim 1 wherein the porosity of the metal felt is between 45 and 95%.